US012068126B2

(12) United States Patent
Casey

(10) Patent No.: US 12,068,126 B2
(45) Date of Patent: Aug. 20, 2024

(54) ELECTRICAL DEVICE HAVING IMPROVED SURFACE MOUNTING ELECTRODES

(71) Applicant: Bourns, Inc., Riverside, CA (US)

(72) Inventor: Kelly C. Casey, Corinth, TX (US)

(73) Assignee: Bourns, Inc., Riverside, CA (US)

( * ) Notice: Subject to any disclaimer, the term of this patent is extended or adjusted under 35 U.S.C. 154(b) by 0 days.

(21) Appl. No.: 18/131,299

(22) Filed: Apr. 5, 2023

(65) Prior Publication Data

US 2023/0290602 A1 Sep. 14, 2023

Related U.S. Application Data

(63) Continuation of application No. PCT/US2021/055856, filed on Oct. 20, 2021.
(Continued)

(51) Int. Cl.
H01J 1/88 (2006.01)
H01J 7/44 (2006.01)
H01J 9/02 (2006.01)
H05K 1/18 (2006.01)
H05K 3/34 (2006.01)

(52) U.S. Cl.
CPC ............. *H01J 1/88* (2013.01); *H01J 7/44* (2013.01); *H01J 9/02* (2013.01); *H05K 1/181* (2013.01); *H05K 3/3442* (2013.01)

(58) Field of Classification Search
CPC ...... H01J 1/88; H01J 7/44; H01J 9/02; H05K 1/181; H05K 3/3442
See application file for complete search history.

(56) References Cited

U.S. PATENT DOCUMENTS 5,384,679 A * 1/1995 Smith .................. H01T 1/14
361/111
2010/0231346 A1 9/2010 Machida
(Continued)

FOREIGN PATENT DOCUMENTS

DE 10059534 C1 * 6/2002 ............... H01T 4/06
JP 2000-091151 A 3/2000
JP 2003-151716 A 5/2003

OTHER PUBLICATIONS

International Search Report dated Feb. 11, 2022 for PCT/US2021/055856 filed Oct. 20, 2021.
(Continued)

*Primary Examiner* — Evan P Dzierzynski
*Assistant Examiner* — Nathaniel J Lee
(74) *Attorney, Agent, or Firm* — Chang & Hale LLP

(57) ABSTRACT

In some embodiments, an electrical device can include a body having a shape that extends along a longitudinal direction, and a set of electrodes implemented on the body at different locations along the longitudinal direction and configured to allow the electrical device to be positioned and mounted to a surface. The set of electrodes can include first and second electrodes configured to provide first and second engagements with the surface, respectively, and to allow a settling motion when the electrical device is positioned on the surface. The set of electrodes can further include a selected electrode having a side configured to allow the settling motion and an engagement portion configured to stop the settling motion and thereby provide a third engagement with the surface.

19 Claims, 10 Drawing Sheets

Related U.S. Application Data

(60) Provisional application No. 63/094,049, filed on Oct. 20, 2020.

(56) References Cited

U.S. PATENT DOCUMENTS

| | | | |
|---|---|---|---|
| 2010/0309598 A1* | 12/2010 | Boy .......................... | H01T 4/12 |
| | | | 361/117 |
| 2019/0348804 A1* | 11/2019 | Crevenat ................... | H01T 1/16 |

OTHER PUBLICATIONS

Written Opinion dated Feb. 11, 2022 for PCT/US2021/055856 filed Oct. 20, 2021.

\* cited by examiner

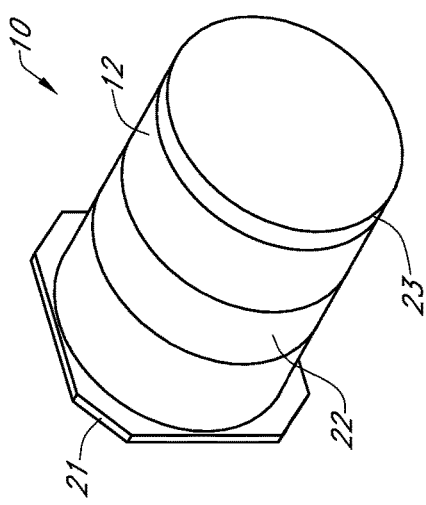
FIG. 1A
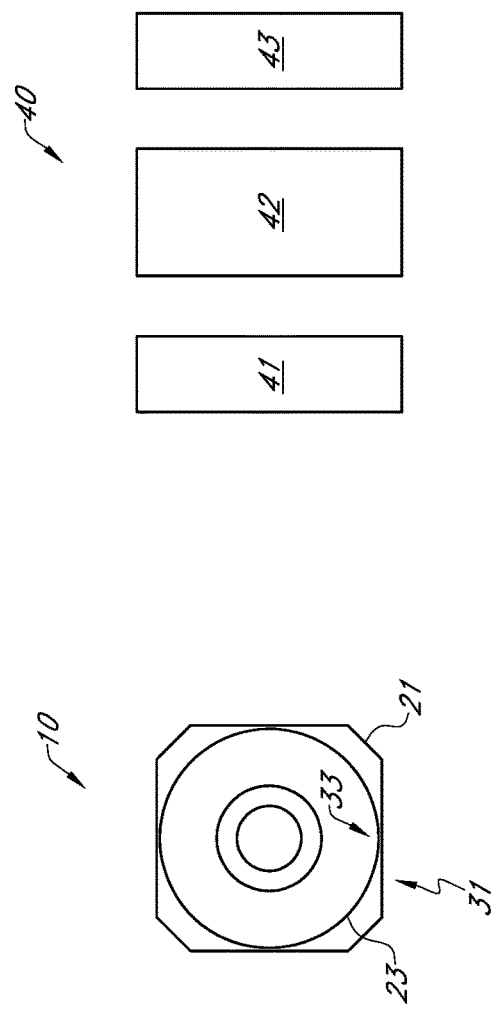
FIG. 1D
FIG. 1C
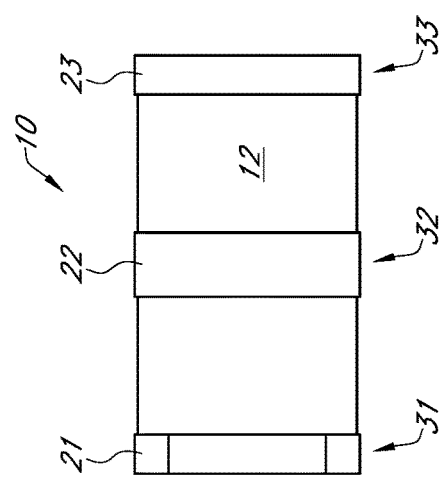
FIG. 1B

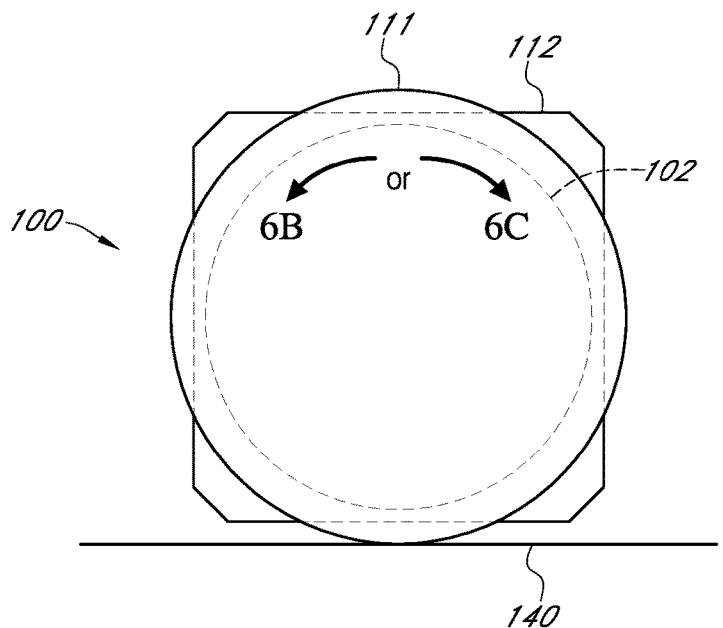
FIG. 6A
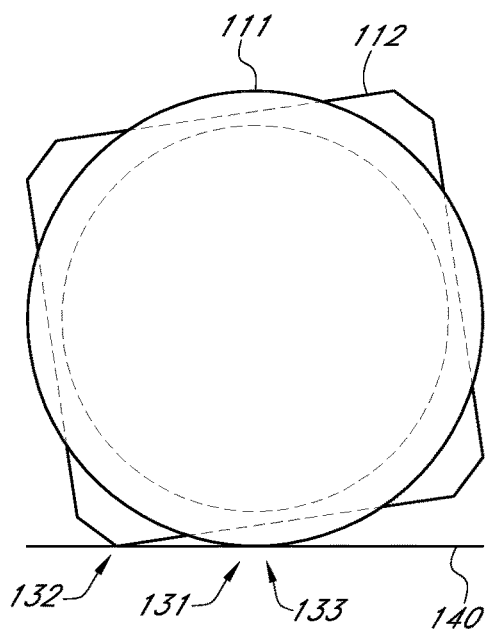 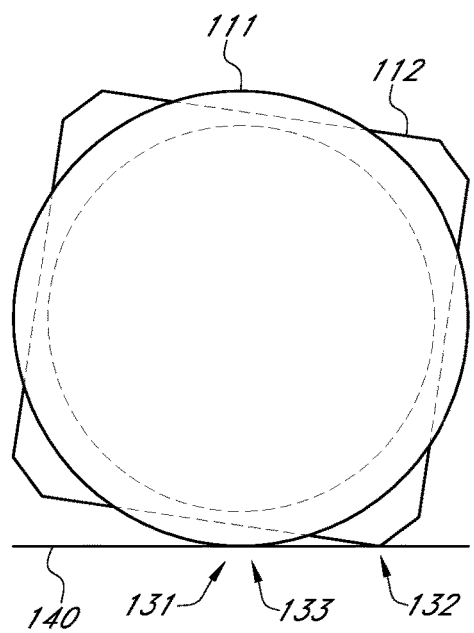
FIG. 6B  FIG. 6C

ELECTRICAL DEVICE HAVING IMPROVED SURFACE MOUNTING ELECTRODES

CROSS-REFERENCE TO RELATED APPLICATION(S)

This application is a continuation of International Application No. PCT/US2021/055856 filed Oct. 20, 2021, entitled ELECTRICAL DEVICE HAVING IMPROVED SURFACE MOUNTING ELECTRODES, which claims priority to U.S. Provisional Application No. 63/094,049 filed Oct. 20, 2020, entitled ELECTRICAL DEVICE HAVING IMPROVED SURFACE MOUNTING ELECTRODES, the benefits of the filing dates of which are hereby claimed and the disclosures of which are hereby expressly incorporated by reference herein in their entirety.

BACKGROUND

Field

The present disclosure relates to electrical devices having surface mounting electrodes.

Description of the Related Art

Many electronic devices are configured to be mounted to a surface of a circuit board. Such devices are commonly referred to as surface-mount devices (SMDs) or surface-mount technology (SMT) devices.

An SMD typically includes a plurality of terminals that provide electrical connections for the SMD. When the SMD is to be mounted on a circuit board, the SMD is typically positioned on a mounting location on the circuit board so that the terminals are in engagement with their respective mounting pads. A mounting operation such as a soldering operation allows the terminals to be secured to the circuit board so as to provide electrical connections between the terminals and their respective mounting pads.

SUMMARY

In some implementations, the present disclosure relates to an electrical device that includes a body having a shape that extends along a longitudinal direction, and a set of electrodes implemented on the body at different locations along the longitudinal direction and configured to allow the electrical device to be positioned and mounted to a surface. The set of electrodes includes first and second electrodes configured to provide first and second engagements with the surface, respectively, and to allow a settling motion when the electrical device is positioned on the surface. The set of electrodes further includes a selected electrode having a side configured to allow the settling motion and an engagement portion configured to stop the settling motion and thereby provide a third engagement with the surface.

In some embodiments, the shape of the body can be a cylindrical shape with a radius and having a longitudinal axis along the longitudinal direction. Each of the first and second electrodes can have a circular perimeter with a radius greater than or equal to the radius of the cylindrical shaped body, such that the settling motion includes a rolling motion. In some embodiments, the radius of the first electrode can be approximately equal to the radius of the second electrode.

In some embodiments, the selected electrode can include a plurality of sides joined by engagement portions, such that each of the plurality of sides is capable of being the side that allows the settling motion, and such that each side is between first and second corners each capable of being the engagement portion. Each side can be spaced from the longitudinal axis of the body by a dimension that is less than the radius of each of the first and second electrodes by a gap dimension, and each of the first and second corners can be spaced from the longitudinal axis of the body by a dimension greater than the radius of each of the first and second electrodes.

In some embodiments, the gap dimension can be greater than or equal to a coplanarity maximum gap dimension associated with a design specification of a similar electrical device having three electrodes. In some embodiments, the gap dimension can be greater than the coplanarity maximum gap dimension.

In some embodiments, the gap dimension can be greater than zero. In some embodiments, the gap dimension can be less than or equal to an upper limit based on an amount of lateral translation of the electrical device resulting from the settling motion, with the amount of lateral translation being estimated as twice the gap dimension. In some embodiments, the gap dimension can be less than or equal to half of the amount of lateral translation.

In some embodiments, the gap dimension can be less than or equal to an upper limit based on a tolerance associated with manufacturing of the mounting surface.

In some embodiments, each of the first and second corners can include one or more vertices, with each vertex having a point that joins a respective pair of segments. Each of the first and second corners can include a first vertex that joins a corner segment and a selected one of the plurality of sides of the selected electrode, and a second vertex that joins the corner segment and a side of the selected electrode adjacent to the selected side of the selected electrode, such that the engagement portion of the selected electrode includes the first vertex. In some embodiments, the corner segment can include a straight portion and/or a curved portion.

some embodiments, each of the plurality of sides of the selected electrode can includes a straight segment and/or a curved segment. The selected electrode can have a polygonal shaped perimeter having sides joined by corners, such that each of the sides of the polygonal shape is a straight segment and capable of being the side that allows the settling motion, and such that each side of the polygonal shape is between first and second corners each capable of being the engagement portion.

In some embodiments, the sides of the polygonal shaped perimeter of the selected electrode can include a square shape having four sides, such that the each of the four sides of the square shape is capable of being the side that allows the settling motion, and such that each side of the square shape is between first and second corners each capable of being the engagement portion. In some embodiments, the square shape of the perimeter of the selected electrode can include a beveled corner that joins each pair of adjacent sides, such that each beveled corner defines two vertices each capable of providing the stopping functionality.

In some embodiments, the set of electrodes can be implemented as two end electrodes and a middle electrode between the two end electrodes. In some embodiments, the end electrodes can be the first and second end electrodes, and the middle electrode can be the selected electrode. In some embodiments, the selected electrode can be one of the end electrodes.

In some embodiments, the electrical device can be a circuit protection device having a first component implemented between one of the end electrodes and the middle electrode, and a second component implemented between the middle electrode and the other one of the end electrodes. In some embodiments, the first component can be configured as a gas discharge tube (GDT) having first and second electrodes provided by or electrically connected to one of the end electrodes and the middle electrode. In some embodiments, the second component can be configured as another GDT having first and second electrodes provided by or electrically connected to the middle electrode and the other one of the end electrodes. In some embodiments, the second component can be configured as a non-GDT device having first and second electrodes provided by or electrically connected to the middle electrode and the other one of the end electrodes.

In some implementations, the present disclosure relates to a method for manufacturing an electrical device. The method includes providing or forming a body such that the body has a shape that extends along a longitudinal direction. The method further includes implementing a set of electrodes on the body at different locations along the longitudinal direction to allow the electrical device to be positioned and mounted to a surface. The set of electrodes includes first and second electrodes configured to provide first and second engagements with the surface, respectively, and to allow a settling motion when the electrical device is positioned on the surface. The set of electrodes further includes a selected electrode having a side configured to allow the settling motion and an engagement portion configured to stop the settling motion and thereby provide a third engagement with the surface.

In some implementations, the present disclosure relates to a surface-mountable circuit protection device that includes a first component implemented between a first end electrode and a middle electrode, and a second component implemented between the middle electrode and a second end electrode, such that the first and second components define a body that extends along a longitudinal direction. Two of the first end, middle and second end electrodes are configured to provide two engagements with a surface and to allow a settling motion when the circuit protection device is positioned on a surface during a surface-mounting process, and the remaining one of the first end, middle and second end electrodes has a side configured to allow the settling motion and an engagement portion configured to stop the settling motion and thereby provide a third engagement with the surface.

In some embodiments, the first component can be a gas discharge tube (GDT), and the second component can be another GDT or a non-GDT device.

In some embodiments, the body can have a cylindrical shape with a radius and a longitudinal axis along the longitudinal direction, and each of the two electrodes can be configured as a rolling electrode to allow the settling motion. The rolling electrode can have a circular perimeter with a radius greater than the radius of the cylindrical shaped body, such that the settling motion includes a rolling motion. In some embodiments, the radii of the two rolling electrodes can be approximately the same.

In some embodiments, the remaining one of the first end, middle and second end electrodes can be configured as a stopping electrode for stopping the rolling motion. In some embodiments, the stopping electrode can have a polygonal shaped perimeter having sides joined by corners, with each corner having one or more vertices, such that each side is spaced from the longitudinal axis of the body by a dimension that is less than the radius of each of the rolling electrodes by a gap dimension. Each corner can be spaced from the longitudinal axis of the body by a dimension greater than the radius of each of the rolling electrodes, such that each corner of the stopping electrode is configured to stop the rolling motion and provide the third engagement with the surface.

In some embodiments, the gap dimension can be greater than or equal to a coplanarity maximum gap dimension associated with a design specification of an electrically-comparable surface-mountable circuit protection device having three electrodes. In some embodiments, the gap dimension can be greater than the coplanarity maximum gap dimension.

In some embodiments, the polygonal shaped perimeter of the stopping electrode can include a square shape having four sides. The square shape of the perimeter of the selected electrode can include a beveled corner that joins each pair of adjacent sides, such that each beveled corner defines two vertices each capable of providing the third engagement with the surface.

In some embodiments, the first and second end electrodes can be implemented as the two rolling electrode, and the middle electrode can be implemented as the stopping electrode. In some embodiments, one of the first and second end electrodes can be implemented as the stopping electrode, and the other one of the first and second end electrodes and the middle electrode can be implemented as the two rolling electrodes.

In some implementations, the present disclosure relates to a method for manufacturing a surface-mountable circuit protection device. The method includes implementing a first component between a first end electrode and a middle electrode, and implementing a second component between the middle electrode and a second end electrode, such that the first and second components define a body that extends along a longitudinal direction. The method further includes configuring two of the first end, middle and second end electrodes to provide two engagements with a surface and to allow a settling motion when the circuit protection device is positioned on a surface during a surface-mounting process. The method further includes configuring the remaining one of the first end, middle and second end electrodes to include a side to allow the settling motion and an engagement portion to stop the settling motion and thereby provide a third engagement with the surface.

In some embodiments, the implementing of the first component can include implementing a gas discharge tube (GDT), and the implementing of the second component can include implementing another GDT or implementing a non-GDT device.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 1A shows a perspective view of a packaged electrical device having a body and three electrodes implemented along the body to allow surface mounting of the electrical device on a mounting surface of a circuit board.

FIG. 1B shows a side view of the electrical device of FIG. 1A.

FIG. 1C shows an end view of the electrical device of FIG. 1A.

FIG. 1D shows a mounting surface that includes a layout of conductive mounting pads arranged to allow surface mounting of the electrical device of FIG. 1A.

FIG. 6A shows an example of how the electrical device of FIGS. 5A and 5B can be initially oriented when placed on a surface during a mounting process.

FIG. 6B shows an example of a settled orientation resulting from a rolling motion of the initially oriented electrical device of FIG. 6A.

FIG. 6C shows another example of a settled orientation resulting from a rolling motion of the initially oriented electrical device of FIG. 6A.

DETAILED DESCRIPTION OF SOME EMBODIMENTS

Figure 2:
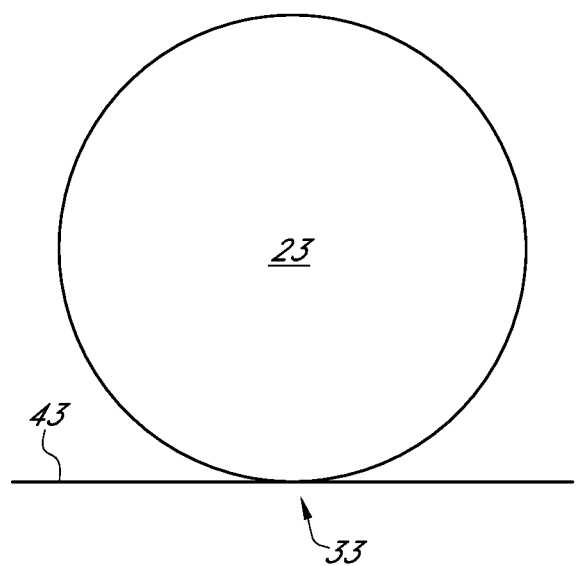
FIG. 2 shows an example of a mounting situation where an electrode of an electrical device does not float with respect to a mounting surface.

The headings provided herein, if any, are for convenience only and do not necessarily affect the scope or meaning of the claimed invention.

FIG. 1A shows a perspective view of a packaged electrical device 10 having a body 12 and three electrodes 21, 22, 23 implemented along the body 12 to allow surface mounting of the electrical device 10 on a mounting surface of, for example, a circuit board. For example, FIG. 1D shows a mounting surface 40 that includes a layout of conductive mounting pads 41, 42, 43. Such conductive mounting pads can be dimensioned and arranged to allow the electrical device 10 to be placed thereon, such that the three electrodes 21, 22, 23 are positioned on the respective conductive mounting pads 41, 42, 43. Once placed as such, each electrode can be secured to the respective conductive mounting pad by, for example, a soldering process.

FIG. 1B shows a side view of the electrical device 10 of FIG. 1A, and FIG. 1C shows an end view of the same electrical device 10. As depicted in FIGS. 1B and 1C, and assuming that the surfaces of the conductive mounting pads 41, 42, 43 are coplanar, the electrodes 21, 22, 23 of the electrical device 10 are ideally dimensioned so that all three contact points or areas 31, 32, 33 of the electrodes 21, 22, 23 will be in contact with the respective mounting pads 41, 42, 43 when the electrical device is positioned thereon. However, such precise dimensions of the electrodes and/or coplanarity of the mounting pads can be difficult to control. Thus, in many situations, when an electrical device is positioned on mounting pads, two of the three electrodes will be in contact with the respective mounting pads, while the third will be floating above the respective mounting pad.

It is noted that an electrical device with the foregoing floating electrode position can result in a more difficult formation of an electrical connection for the floating electrode. Thus, in many applications, a circuit board (e.g., a printed circuit board, or PCB) assembly specification often specifies a coplanarity maximum gap allowed between a floating electrode and a corresponding mounting surface of the circuit board. Even with such specification, variations in electrode dimensions and/or mounting surfaces on a circuit board can result in an undesirable floating position of an electrode of an electrical device.

Figure 3:
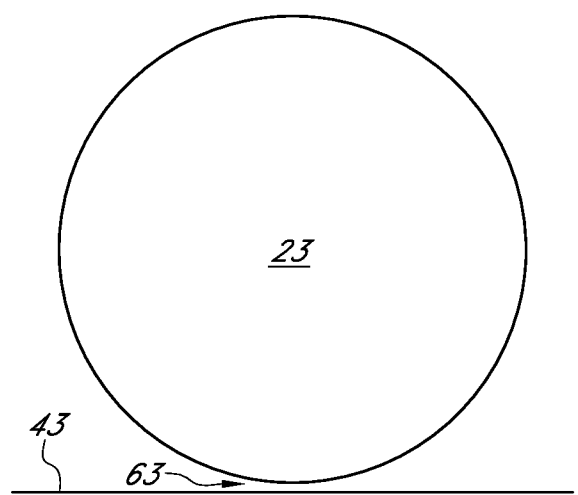
FIG. 3 shows an example of a mounting situation where an electrode of an electrical device floats with respect to a mounting surface.

For example, FIG. 2 shows an electrode 23 (e.g., the end electrode 23 in the example of FIGS. 1A-1C) that does not float with respect to a mounting surface 43, and FIG. 3 show a similar electrode 23 that floats with respect to a mounting surface 43. It is noted that such a floating situation can arise from, for example, the electrode 23 being slightly undersized, and/or one or more of other electrodes being slightly oversized.

In the example of FIG. 2, the electrode 23 is shown to be in engagement with the mounting surface 43 at an engagement location 33. For the purpose of description, it will be understood that the mounting surface 43 can include a layer of soldering material having, for example, a thin solder paste layer applied (e.g., screen printed) over a circuit board with the mounting surface 43 (e.g., a solder pad).

In a soldering process such as a reflow soldering process, heat can be applied to melt the foregoing soldering material, and the melted soldering material can flow about the engagement location 33 to form a solder structure aided by surface tension and/or capillary action associated with the melted soldering material. Once cooled, such a solder material structure can secure the electrode 23 to the mounting surface 43 and support the engagement therebetween.

In the example of FIG. 3, the electrode 23 is shown to be floating over the mounting surface, thereby resulting in a gap 63 being present between the electrode 23 and the mounting surface 43. Similar to the example of FIG. 2, it will be understood that the mounting surface 43 can include a layer of soldering material having a thin solder paste layer applied (e.g., screen printed) over a circuit board with the mounting surface 43 (e.g., a solder pad)). Accordingly, without any portion of the electrode 23 touching the soldering material of the mounting surface 43, solder connection will not be made between the electrode 23 and the mounting surface 43.

Described herein are examples related to an electrical device having a set of electrodes configured such that when placed on a mounting area, the electrical device settles in a mounting orientation with all of the electrodes in engagements with respective mounting surfaces of the mounting area. In some embodiments, such a set of electrodes can include a plurality of electrodes for providing first engagements with respective mounting surfaces, and a selected electrode for providing a second engagement with a respective mounting surface when in the settled mounting orientation. In various examples described herein, it is assumed that the first engagements of the respective electrodes with the respective mounting surfaces occur before the second engagement of the selected electrode with the respective mounting surface. However, it will be understood that in some mounting processes, the second engagement may occur substantially simultaneously or prior to the first engagements.

In an example context of a three-electrode electrical device, a plurality of electrodes that provide the foregoing first engagements can be two of the three electrodes, and a selected electrode that provides the second engagement can be the third electrode dimensioned appropriately. Examples of such three-electrode configurations are described herein in greater detail.

Figure 4A:
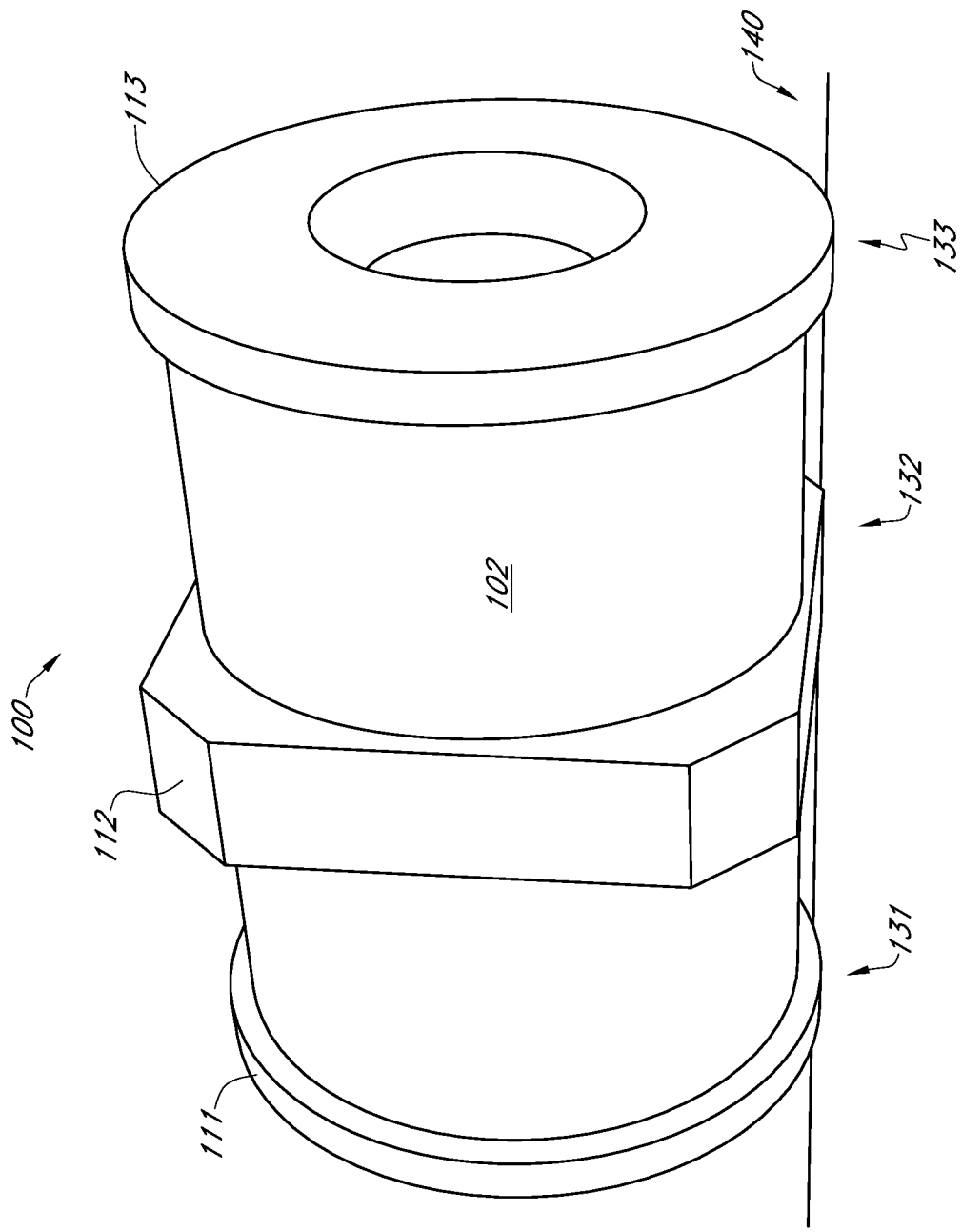
FIG. 4A shows a perspective view of a packaged electrical device having one or more features as described herein, where the electrical device has settled into a mounting orientation with all mounting electrodes in engagements with respective mounting surfaces.
Figure 4B:
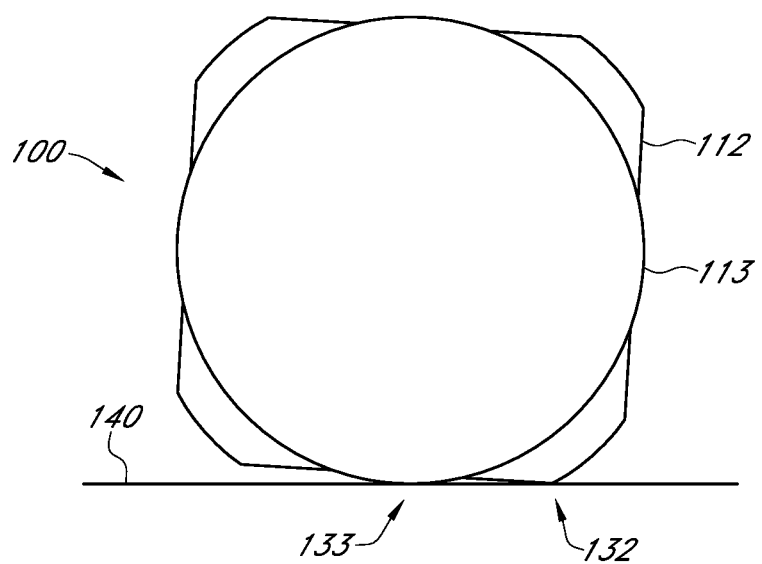
FIG. 4B shows an end view of the electrical device of FIG. 4A in the settled mounting orientation.
Figure 4C:
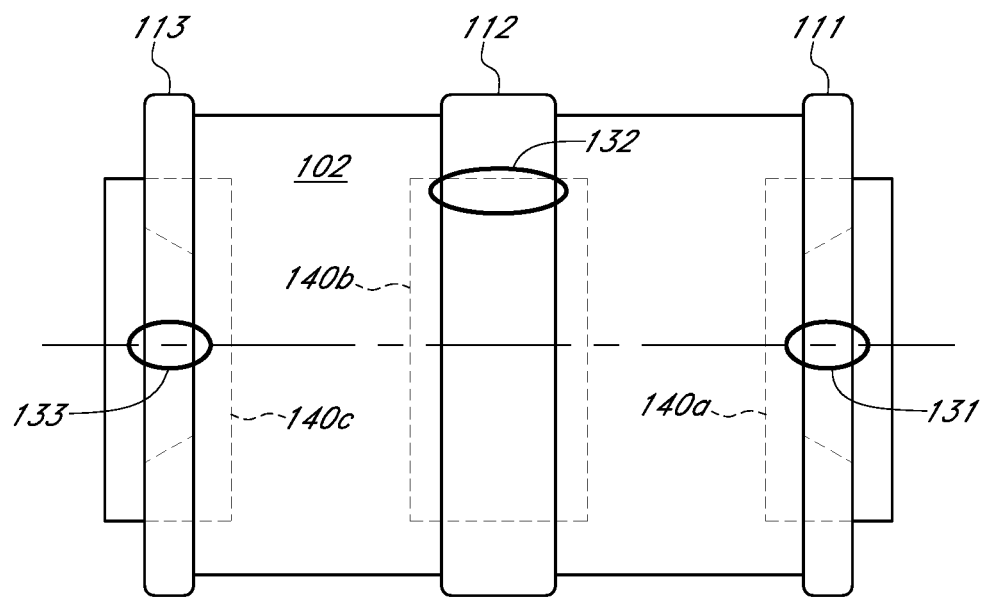
FIG. 4C shows a side view of the electrical device of FIG. 4A in a settled mounting orientation, when viewed from underside of the mounting surfaces.

FIG. 4A shows a perspective view of a packaged electrical device 100 having one or more features as described herein, where the electrical device 100 has settled into a mounting orientation where all three electrodes are in engagements with respective mounting surfaces. FIG. 4B shows an end view of the electrical device 100 of FIG. 4A in the settled mounting orientation. FIG. 4C shows a side view of the electrical device 100 of FIG. 4A in the settled mounting orientation, when viewed from underside of the mounting surfaces.

Referring to FIGS. 4A-4C, in some embodiments, the electrical device 100 can include a body 102 and three electrodes 111, 112, 113 implemented along the body 102 to allow surface mounting of the electrical device 100 on a mounting area 140 of, for example, a circuit board. For the purpose of description, it will be understood that the mounting area 140 includes a mounting surface for each of the electrodes 111, 112, 112. Thus, such mounting surfaces can be indicated as 140a (for the electrode 111), 140b (for the electrode 112), and 140c (for the electrode 113).

In the example of FIGS. 4A-4C, it will be understood that when the electrical device 100 is mounted to the mounting area 140 in the settled orientation, each electrode engages the respective mounting surface (e.g., a solder pad with a layer of thin solder paste) and therefore is capable of being secured thereto with a solder structure (e.g., reflowed solder structure).

Referring to FIGS. 4A-4C, in some embodiments, two of the three electrodes 111, 112, 113 can be configured to provide a set of electrodes configured such that when the electrical device 100 is placed on a surface, the electrical device 100 rolls, or has a tendency to roll, in a direction based on engagements made by the two electrodes with the surface. In the example of FIGS. 4A-4C, the two end electrodes 111, 113 are shown to form the set of electrodes that promote the foregoing rolling motion of the electrical device 100. In some embodiments, each of such electrodes (111, 113) can have a circular shaped perimeter to allow such rolling motion.

In some embodiments, the middle electrode 112 can be implemented as a selected electrode configured to stop the rolling of the electrical device 100 on the surface by having a portion of the selected electrode engage the surface. As described herein, such a rolling motion and the stopping action by the selected electrode can occur when the electrodes 111, 112, 113 are placed over, for example, soldering material layers on the respective mounting surfaces.

Accordingly, when the reflow process is complete, all three electrodes 111, 112, 113 can be in engagement with their respective mounting surfaces with respective solder structures providing secure mounting support. More particularly, for each of the two end electrodes 111, 113, a portion of the circular perimeter in engagement with the respective mounting surface provides the engagement location for that electrode. For the selected electrode (112), the portion that provides the stopping action can also provide the engagement location.

Thus, when the electrical device 100 is in the foregoing settled orientation, portions of the three electrodes 111, 112, 113 are all in engagement with the respective mounting surfaces 140a, 140b, 140c. Such engagements are indicated as points or areas 131 (for the electrode 111 on the mounting surface 140a), 132 (for the electrode 112 on the mounting surface 140b) and 133 (for the electrode 113 on the mounting surface 140c).

Figure 5A:
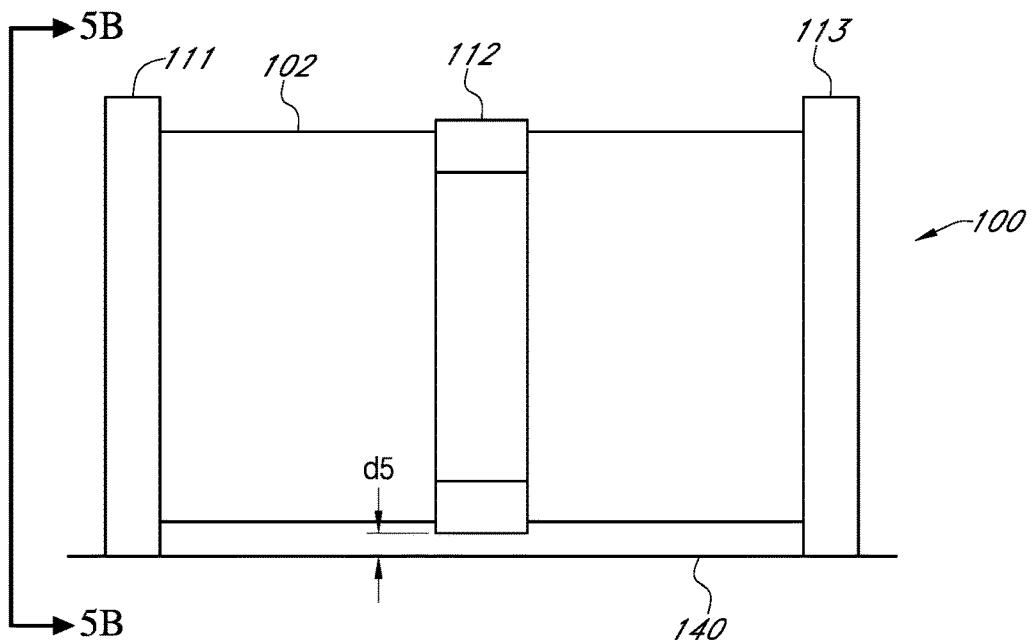
FIG. 5A shows a side view of an electrical device similar to the electrical device of FIGS. 4A-4C.
Figure 5B:
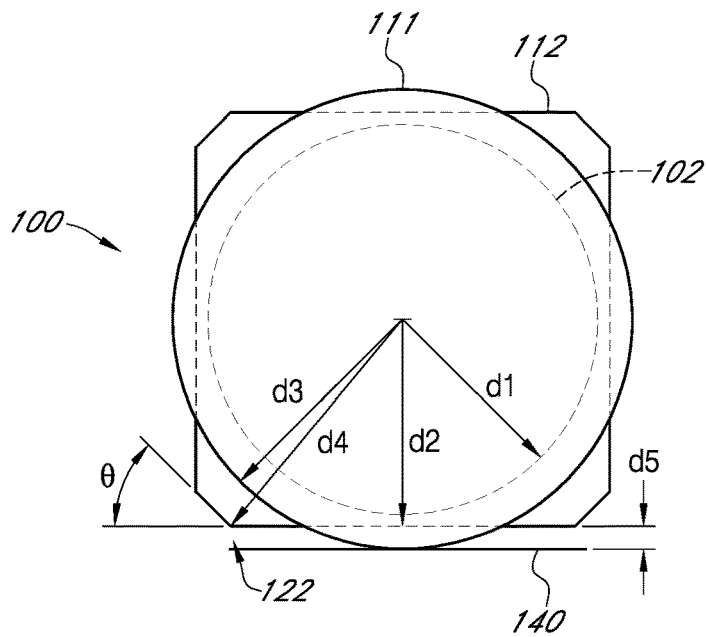
FIG. 5B shows an end view of the electrical device of FIG. 5A.

FIG. 5A shows a side view of an electrical device 100 similar to the electrical device 100 of FIGS. 4A-4C, and FIG. 5B shows an end view of the electrical device 100 of FIG. 5A. In the example of FIGS. 5A and 5B, various dimensions associated with three electrodes 111, 112, 113 are indicated, where such dimensions can be selected to provide the all-electrodes engagements functionality described in reference to FIGS. 4A-4C.

Referring to FIGS. 5A and 5B, the electrical device 100 can include a body 102, and the three electrodes 111, 112, 113 can be implemented along such a body. More particularly, in some embodiments, the body 102 can have a cylindrical shape having a radius of d1, and each of end electrodes 111, 113 can have a circular shaped perimeter with a radius of d3. In some embodiments, the radius of the end electrode 111 can be approximately the same as the radius of the other end electrode 113. It is noted that even if the end electrodes 111, 113 do not have the same radius, the same two electrodes can provide two engagement locations with respective mounting surfaces, provided that the middle electrode 112 is dimensioned as described herein.

FIGS. 5A and 5B show that in some embodiments, the middle electrode 112 of the electrical device 100 can be configured as a selected electrode configured to stop the rolling motion supported by the two end electrodes 111, 113, and to provide the third engagement with a respective mounting surface. In some embodiments, such a selected electrode (112 in FIGS. 5A and 5B) can be dimensioned to have a square perimeter shape (side dimension of 2×d2) with beveled corners. Each beveled corner can form an angle θ as shown in FIG. 5B, and the angle θ can be, for example, approximately 45 degrees. For such a square shaped electrode with 45-degree beveled corners, each beveled corner defines two vertices 122, with each vertex joining a side of the square shape and a corresponding bevel segment by an angle of approximately 135 degrees.

In the example of FIGS. 5A and 5B, each corner is depicted as having two vertices joined by a straight segment. It will be understood that in some embodiments (e.g., in the example of FIGS. 4A-4C, the two vertices of each corner can be joined by an arc of a circle having a diameter larger than the diameter (2×d3) of the circular electrodes (e.g., 111, 113 in FIGS. 5A and 5B). Thus, it will be understood that a selected electrode having one or more features as described herein can have corners having different shapes.

It is also noted that in the examples of FIGS. 4 and 5, the selected electrode 112 is depicted as having a generally square shape, such that the dimension d2 (e.g., in FIG. 5B) is described as being half of a side dimension. It will be understood that a side of such a generally square shape does not necessarily need to be a straight segment between the two corresponding corners. For example, a side of such a generally square shape may have a slight curve to form a crest at approximately mid-point, such that the dimension d2 (e.g., in FIG. 5B) is between the center of the generally square shape and the crested mid-point.

In some embodiments, and assuming that the circular shaped end electrodes 111, 113 have the same radius d3, the square shape of the selected electrode 112 can be dimensioned such that the dimension d2 (i.e., half of the side dimension) is less than the radius d3 of the circular shaped end electrodes 111, 113 by an amount d5. Such a configuration can allow a rolling motion of the electrical device 100 when resting on a surface (140) by the two circular shaped end electrodes 111, 113.

Referring to FIG. 5B, dimension d4 (distance from the center to each vertex 122 of the selected electrode 112) can be selected to be greater than the radius d3 of the circular shaped end electrodes 111, 113. Such a configuration can allow each vertex 122 to stop a rolling motion of the electrical device 100 supported by the two circular shaped end electrodes 111, 113, and also provide an engagement with the surface (140).

In the example electrical device 100 of FIGS. 5A and 5B, the gap dimension d5 can be a difference between the radius (d3) of the circular shaped electrodes 111, 113 and half of the side dimension of the selected electrode 112 (d2). Accordingly, if the electrical device 100 is placed on a surface (140) such that one side of the selected electrode 112 is approximately parallel to the surface 140, the resulting gap between that side of the selected electrode 112 and the surface 140 is approximately d5. In some embodiments, such a gap dimension d5 can be selected to be greater than a coplanarity maximum gap ($d_{max\_gap}$) specified for a similar electrical device having three electrodes.

Accordingly, in some embodiments, the dimension d2 (half of the side dimension of the selected electrode 112) can be greater than the dimension d1 (radius of the body 102), and the dimension d4 (distance from the center to each vertex 122 of the selected electrode 112) can be greater than the dimension d3 (radius of the circular shaped electrodes 111, 113). For such dimensions, the foregoing dimension d5 can be greater than or equal to $1.0 \times d_{max\_gap}$, $1.1 \times d_{max\_gap}$, $1.2 \times d_{max\_gap}$, $1.3 \times d_{max\_gap}$, $1.4 \times d_{max\_gap}$, $1.5 \times d_{max\_gap}$, $1.6 \times d_{max\_gap}$, $1.7 \times d_{max\_gap}$, $1.8 \times d_{max\_gap}$, $1.9 \times d_{max\_gap}$, $2.0 \times d_{max\_gap}$, $2.5 \times d_{max\_gap}$, $3.0 \times d_{max\_gap}$, $4.0 \times d_{max\_gap}$, $5.0 \times d_{max\_gap}$, or $10 \chi\, d_{max\_gap}$. Thus, if an example value of 0.1 mm is specified for $d_{max\_gap}$, the dimension d5 can be greater than or equal to 0.10 mm, 0.12 mm, 0.13 mm, 0.14 mm, 0.15 mm, 0.16 mm, 0.17 mm, 0.18 mm, 0.19 mm, 0.20 mm, 0.25 mm, 0.30 mm, 0.40 mm, 0.50 mm, or 1.0 mm.

Referring to FIGS. 5A and 5B, in some embodiments, the dimension d2 is less than the dimension d3, and such a condition of d3>d2 can include manufacturing tolerances. Such a condition can also be represented as a condition d5>0.

In some embodiments, the dimension d5 can have some maximum value based on an allowed amount of roll that can be tolerated or desired during a mounting process. For example, an angle of tilt of a square selected electrode from a neutral position (e.g., FIG. 6A) to a settled position (e.g., FIG. 6B or 6C) can be estimated by a right triangle with a hypotenuse of d3 and a side of d5. Such an angle of tilt can be referred to as angle of roll $\alpha$, such that $d5=d3\times\sin(\alpha)$. For small values of $\alpha$ (in radians), one can estimate $\sin(\alpha)\approx\alpha$, such that d5 d3×α.

Further, one can estimate the amount of lateral movement of the corresponding device resulting from the foregoing rolling motion during a mounting process. Such lateral movement can be estimated as $2\times d3\times\alpha$ (in radians). With $\alpha\approx d5/d3$, one can expect the device to move laterally by an amount 2×d5 before settling.

Accordingly, in some embodiments, the dimension d5 can be selected to be greater than zero and less than half of the allowed lateral translation. In some embodiments, such a condition on the dimension d5 can be based on a tolerance associated with manufacturing of a circuit board (e.g., printed circuit board). For example, the dimension d5 can have a value greater than zero and less than or equal to 2 mm. In another example, the dimension d5 can have a value greater than zero and less than or equal to 0.5 mm.

In a more specific example, a conventional 5 mm three-electrode device such as a three-electrode gas discharge tube typically has two circular electrodes (with a first circular electrode at one end of a body and a second circular electrode at the middle of the body) and an anti-roll electrode at the other end of the body. For such a conventional device, diameters of the two circular electrode and spacing between the opposing sides of the anti-roll electrode all have a specified dimension of 5 mm, with an overall tolerance of ±0.2 mm. Thus, in the context of radius (d3) and half-side dimension (d2) of FIGS. 5A and 5B, a coplanarity maximum gap ($d_{max\_gap}$) value can be 0.1 mm, which is half of the absolute value of the foregoing overall tolerance of ±0.2 mm.

It is noted that for the purpose of description, the gap dimension d5 of FIGS. 5A and 5B is the difference between the radius (d3) of the circular shaped electrodes 111, 113 and half of the side dimension of the selected electrode 112 (d2). It will be understood that such a gap dimension (d5) can be determined by a difference between half of a specified diameter value of the circular shaped electrodes 111, 113 (d3) and half of a specified value of the side dimension of the selected electrode 112 (d2). More particularly, and by way of examples, if a circular electrode diameter is indicated as 5 mm±0.2 mm, then its specified diameter value can be 5 mm, and the dimension d3 can be 2.5 mm. Similarly, if a selected electrode has a side dimension indicated as 4.8 mm±0.2 mm, then its specified value the side dimension can be 4.8 mm, and the dimension d2 can be 2.4 mm.

It will also be understood that gap dimension (d5) can be determined by a difference between half of a measured diameter value of the circular shaped electrodes 111, 113 (d3) and half of a measured value of the side dimension of the selected electrode 112 (d2). For example, if an average value of circular electrode diameter is measured to be approximately 5 mm among a sample of N devices (e.g., N=10 or 100), then the measured diameter value can be 5 mm, and the dimension d3 can be 2.5 mm. Similarly, if an average value of side dimension of selected electrode is measured to be approximately 4.8 mm among the same sample of N devices, then the measured value the side dimension can be 4.8 mm, and the dimension d2 can be 2.4 mm.

It is noted that in some embodiments, each of the two circular electrodes may or may not be concentric with a corresponding body. Further, if two such bodies form an overall body (e.g., 102 in FIG. 5A), such bodies may or may not be concentric. Thus, it will be understood that the foregoing example of dimensions and tolerances may or may not include concentricity errors associated with the circular electrodes and/or the respective bodies.

FIGS. 6A-6C show examples of how the electrical device 100 of FIGS. 4 and 5 can undergo a motion after an initial contact with a surface to result in a settled orientation with respect to the surface. Similar to FIG. 5B, the electrical device 100 in FIGS. 6A-6C is shown as viewed from one end.

Referring to FIG. 6A, the electrical device 100 is shown to be placed on a surface 140 such that the end electrode 111 is in contact with the surface 140. Although not shown in the end view of FIG. 6A, it will be understood that the other end electrode (113 in FIG. 5A) is also in contact with the surface 140. The middle electrode 112, dimensioned as described herein with respect to the end electrodes 111, 113, is shown to be not in contact with the surface 140.

From the initial orientation as shown in FIG. 6A, the electrical device 100 can roll to either of two directions. The first rolling direction can be to the left (when viewed as in FIG. 6A), and such a rolling motion can result in the electrical device 100 settling into a first settled orientation as shown in FIG. 6B. The second rolling direction can be to the right, and such a rolling motion can result in the electrical device 100 settling into a second settled orientation as shown in FIG. 6C.

In each of the first and second settled orientations, the electrical device 100 is shown to have three contact locations associated with the three electrodes. More particularly, if the electrical device 100 is in the first settled orientation (FIG. 6B), three contact locations 131, 132, 133 are provided with respect to the surface 140 by the respective electrodes 111, 112, 113, with the middle contact location 132 being provided by the left vertex of the middle electrode 112. Similarly, if the electrical device 100 is in the second settled orientation (FIG. 6C), three contact locations 131, 132, 133 are provided with respect to the surface 140 by the respective electrodes 111, 112, 113, with the middle contact location 132 being provided by the right vertex of the middle electrode 112.

In the example of FIGS. 6A-6C, it is assumed that the initial orientation of the electrical device 100, as shown in FIG. 6A, has the surface-facing side of the middle electrode 112 approximately parallel to the surface 140. Such an example initial orientation can allow the electrical device 100 to roll to the left as in FIG. 6B or to the right as in FIG. 6C.

In some applications, however, the electrical device 100 may or may not be placed on the surface 140 with such an initial orientation. For example, an initial orientation of the electrical device 100 may be similar to the example of FIG. 6A, but tilted slightly to the left and the middle electrode 112 not in contact with the surface 140. From such an initial orientation, the electrical device 100 will most likely settle to the first settled orientation of FIG. 6B. Similarly, an initial orientation of the electrical device 100 may be similar to the example of FIG. 6A, but tilted slightly to the right and the middle electrode 112 not in contact with the surface 140. From such an initial orientation, the electrical device 100 will most likely settle to the second settled orientation of FIG. 6C.

In another example, the electrical device 100 may be positioned on the surface such that one of the vertices of the surface-facing side of the middle electrode 112 forms an initial contact with the surface. In such a situation, the electrical device 100 can pivot about the initial contact vertex until the two end electrodes 111, 113 contact respective surfaces to result in a three-contact orientation similar to one of FIGS. 6B and 6C.

From the foregoing examples, one can see that the electrical device 100 of FIGS. 4-6 forms a three-point engagement configuration with respect to a mounting surface. Accordingly, such three points of engagement can provide stability for the electrical device as the three respective electrodes are secured by, for example, a reflow soldering process.

Figure 7:
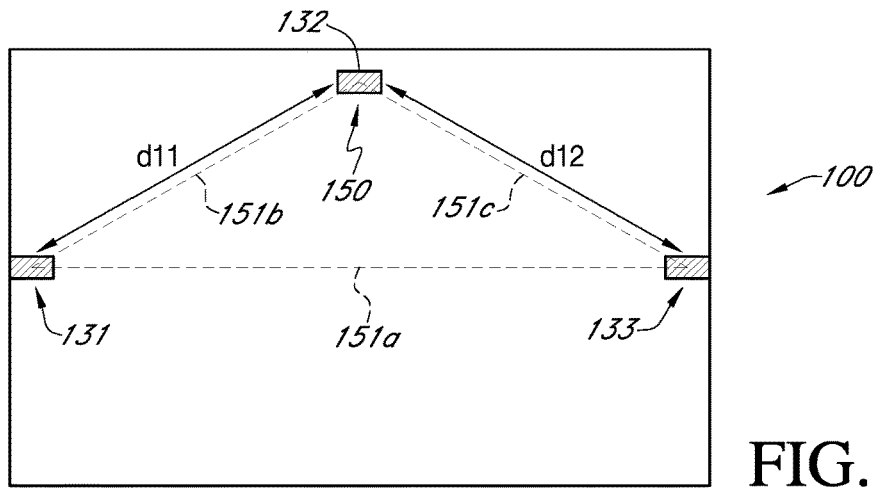
FIG. 7 depicts an example of a three-point engagement that can be provided by an electrical device having one or more features as described herein.

FIG. 7 depicts the foregoing three-point engagement that can be provided by an electrical device 100 having one or more features as described herein. Such three engagement locations are indicated as 131, 132, 133, where the first and third engagement locations 131, 133 are provided by the two end electrodes that support a settling motion (e.g., a rolling motion), and the second engagement location 132 is provides by the middle electrode configured as a selected electrode for stopping the settling motion. Accordingly, the example three engagement locations are shown to form a triangle to provide a stable support for the electrical device 100, as well as a solid contact between each of the three electrodes and the respective mounting surface.

FIG. 7 shows that in some embodiments, an electrical device 100 having three electrodes can be configured such that the three electrodes provide three-point engagement locations when the electrical device 100 settles on a flat surface. Such three-point engagement locations can be provided regardless of how the electrical device 100 is oriented when it is positioned on the flat surface, since two of the electrodes can be configured to provide initial two-point engagement locations and allow a settling motion, and the selected electrode can be configured to stop the settling motion with the third engagement location.

In the example of FIG. 7, the third engagement location 132 provided by the selected electrode (middle electrode) is also indicated as 150. Such a three-point engagement configuration is shown to form a triangle with a side 151a that joins the engagement locations 131, 133, a side 151b that joins the engagement locations 131, 132, and a side 151c that joins the engagement locations 132, 133. Accordingly, the side 151a opposite from the engagement location 150 provided by the selected electrode can be a base of the triangle, and the two sides 151b, 151c can have lengths that may or may not be the same. In some embodiments, the selected electrode can be implemented to be at a midway location along the base side 151a between the two end electrodes; and in such a configuration, the resulting triangle formed by the three engagement locations can be an isosceles triangle.

Figure 8:
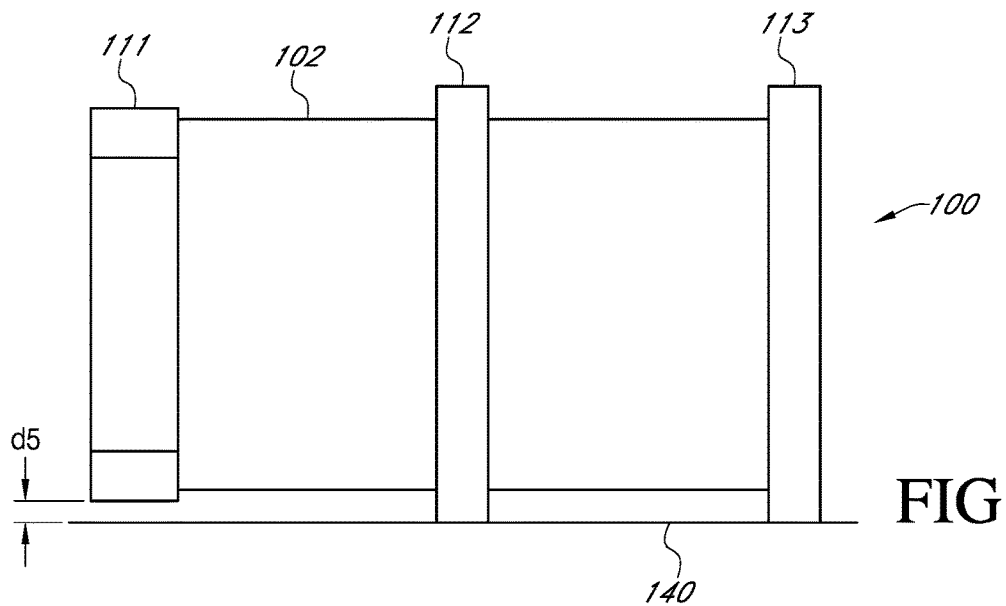
FIG. 8 shows an electrical device configured to provide another example of a three-point engagement.

In the examples described in reference to FIGS. 4-7, the electrical device 100 is configured such that the selected electrode (112) dimensioned to stop a settling motion (e.g., a rolling motion) and provide a third engagement location is an electrode implemented between two end electrodes. FIG. 8 shows that in some embodiments, an electrical device 100 can be configured such that a selected electrode dimensioned to stop a settling motion (e.g., a rolling motion) and provide a third engagement location is one of two end electrodes. Thus, in the example of FIG. 8, a middle electrode 112 and an end electrode 113 can be, for example, circular shaped electrodes similar to circular shaped end electrodes 111, 113 of FIG. 5A; and the other end electrode 111 can be the selected electrode similar to the middle electrode 112 of FIG. 5A.

Figure 9:
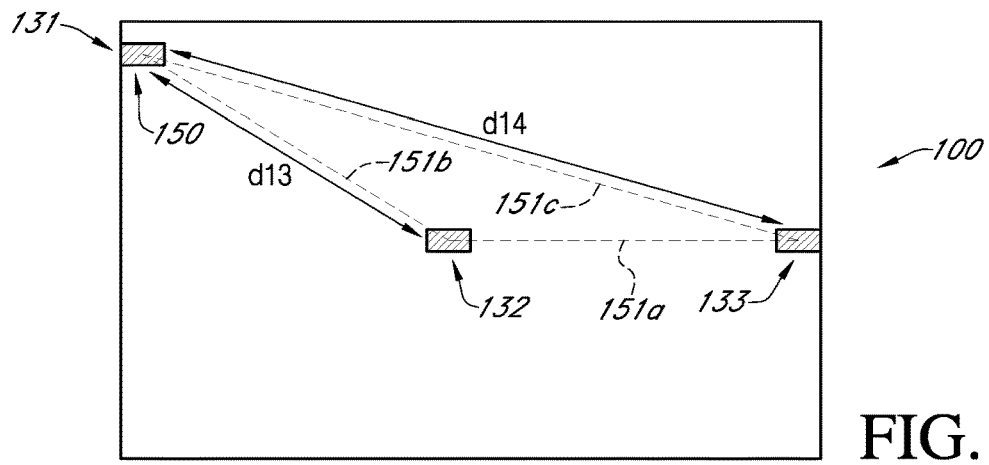
FIG. 9 shows an example of a three-point engagement that can be provided by the electrical device of FIG. 8.

Configured in the foregoing manner, the selected electrode 111 can provide a gap dimension d5 when the electrical device 100 is positioned on a flat surface 140 in an orientation similar to the example orientation of FIGS. 5A and 5B before settling into a settled orientation. When the electrical device 100 of FIG. 8 is in such a settled orientation, three engagement locations can be provided as shown in FIG. 9 and indicated as 131, 132, 133, where the engagement locations 132, 133 are provided by the middle electrode (112 in FIG. 8) and one of the end electrodes (113) that support a settling motion (e.g., a rolling motion), and the engagement location 131 is provides by the other end electrode configured as a selected electrode for stopping the settling motion. Accordingly, the example three engagement locations are shown to form a triangle to provide a stable support for the electrical device 100, as well as a solid contact between each of the three electrodes and the respective mounting surface.

In the example of FIG. 9, the engagement location 131 provided by the selected electrode (end electrode) is also indicated as 150. Such a three-point engagement configuration is shown to form a triangle with a side 151*a* that joins the engagement locations 132, 133, a side 151*b* that joins the engagement locations 131, 132, and a side 151*c* that joins the engagement locations 131, 133.

Referring to the triangle views of the examples of FIGS. 7 and 9, it is noted that in FIG. 7, the engagement location 132 (also indicated as 150) provided by the selected electrode (middle electrode) results from stopping of a settling motion (e.g., a rolling motion) by a feature (e.g., a vertex) associated with the shape of the selected electrode. Accordingly, such an engagement location (150, 132) can be a pivot location for a force applied to the electrical device 100.

With respect to the example of FIG. 9, it is also noted that the engagement location 131 (also indicated as 150) provided by the selected electrode (end electrode) results from stopping of a settling motion (e.g., a rolling motion) by a feature (e.g., a vertex) associated with the shape of the selected electrode. Accordingly, such an engagement location (150, 131) can be a pivot location for a force applied to the electrical device 100.

It is noted that during one or more process steps associated with mounting of an electrical device onto, for example, a circuit board, the electrical device and the circuit board can be subjected to one or more forces For example, a change in temperature can result in expansions/contractions of different parts based on differences in thermal coefficients. In another example, changes in states (e.g., solid to liquid and liquid to solid) during a reflow soldering process can result in one or more forces being applied to each of the soldering locations. Accordingly, each of the electrodes associated with the electrical device can be subjected to one or more forces.

Thus, with respect to a pivot location (e.g., 150, 132 in FIG. 7, and 150, 131 in FIG. 9) of an electrical device 100, a force applied to another electrode can result in a torque being applied to the pivot location, with torque magnitude that is proportional to a distance between the force application location of the electrode and the pivot location.

For example, in the configuration of FIG. 7, the pivot location is 150, 132 associated with the middle electrode. Thus, a force applied at the end-electrode engagement location 131 results in a torque being applied to the pivot location 150, 132, with the torque magnitude being proportional to the lever arm dimension d11 with respect to the pivot location 150, 132. Similarly, a force applied at the end-electrode engagement location 133 results in a torque being applied to the pivot location 150, 132, with the torque magnitude being proportional to the lever arm dimension d12 with respect to the pivot location 150, 132.

In another example, in the configuration of FIG. 9, the pivot location is 150, 131 associated with one of the end electrodes. Thus, a force applied at the middle-electrode engagement location 132 results in a torque being applied to the pivot location 150, 131, with the torque magnitude being proportional to the lever arm dimension d13 with respect to the pivot location 150, 131. Similarly, a force applied at the end-electrode engagement location 133 results in a torque being applied to the pivot location 150, 131, with the torque magnitude being proportional to the lever arm dimension d14 with respect to the pivot location 150, 131.

It is noted that if the electrode spacing dimensions are similar between the examples of FIGS. 7 and 9, the lever arm dimension d13 of FIG. 9 can be similar to the lever arm dimensions d11, d12 of FIG. 7. However, the lever arm dimension d14 of FIG. 9 can be significantly greater than the lever arm dimensions d11, d12 of FIG. 7. Accordingly, a force applied at the end-electrode engagement location 133 of FIG. 9 can result in a significantly larger torque being applied to the pivot location 150, 131 when compared to a torque being applied to the pivot location 150, 132 resulting from a force applied to each of the end-electrode engagement locations 131, 133 in FIG. 7. Thus, in some embodiments, the example configuration of FIG. 7 (where the selected electrode is a middle electrode) may be preferable in mounting situations where torque effects are of concern.

In various examples disclosed herein, a selected electrode (e.g., 112 in FIGS. 4, 5, 6 and 8) is described as having a polygonal shape, such as a square shape, with sides and respective corners, where each side is a straight segment, and each corner includes two vertices joined by a straight or curved corner segment. However, it will be understood that a selected electrode that provides one or more features as described herein, can be implemented to have a shape different than a polygonal shape. For example, a selected electrode can be implemented with a shape that includes a side configured to allow a settling motion, such as a rolling motion, of a corresponding electrical device, and an engagement portion configured to stop the settling motion and thereby provide a third engagement with a mounting surface for the electrical device.

In some embodiments, the foregoing selected electrode can include a plurality of sides joined by engagement portions, such that each of the plurality of sides is capable of being the side that allows the settling motion, and such that each side is between first and second corners with each corner capable of being the engagement portion. Each side can be spaced from the longitudinal axis of a body by a dimension that is less than the radius of each of first and second circular electrodes by a gap dimension, and each of the first and second corners can be spaced from the longitudinal axis of the body by a dimension greater than the radius of each of the first and second electrodes.

In some embodiments, each of the plurality of sides of the selected electrode can include a straight segment and/or a curved segment. For example, a polygonal shaped selected electrode can include a plurality of straight segments. In another example, a selected electrode can have an overall shape that is similar to a polygonal shape, but where some or all of the sides is/are curved segment(s). In some embodiments, each of such curved segment(s) can have a convex or concave shape with respect to an interior portion (e.g., center) of the selected electrode.

For the purpose of description, it will be understood that a corner can have any shape that joins two adjacent sides of a selected electrode. Thus, in some embodiments, a corner can include one or more vertices, with each vertex having a point that joins a respective pair of segments. In the examples of FIGS. 4, 5, 6 and 8, each corner is shown to include a first vertex that joins a corner segment (e.g., straight or curved) and a selected side of the selected electrode, and a second vertex that joins the corner segment and a side of the selected electrode adjacent to the selected side of the selected electrode, such that the engagement portion of the selected electrode includes the first vertex.

In various examples described herein, an electrical device is assumed to have three electrodes for mounting onto a surface. However, it will be understood that in some embodiments, one or more features of the present disclosure can also be implemented for an electrical device having more than three electrodes.

Figure 10:
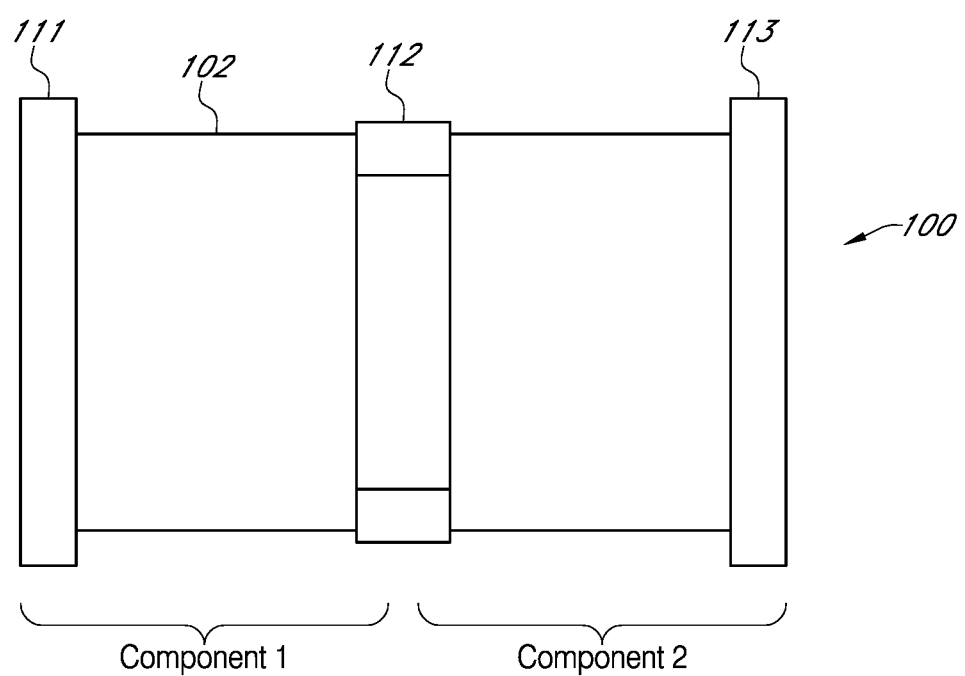
FIG. 10 shows that in some embodiments, an electrical device having one or more features as described herein can include a first component and a second component electrically connected and packaged together so as to provide three electrodes.

FIG. 10 shows that in some embodiments, an electrical device 100 having one or more features as described herein can include a first component (Component 1) and a second component (Component 2) electrically connected and packaged together so as to provide three electrodes 111, 112, 113. Such components can be electrically similar components, or be electrically different components. Examples of both configurations are described herein in greater detail.

In some embodiments, one of the two components of the electrical device 100 of FIG. 10 can be a gas discharge tube (GDT). The other of the two components can be another GDT, or a non-GDT component.

Figure 11A:
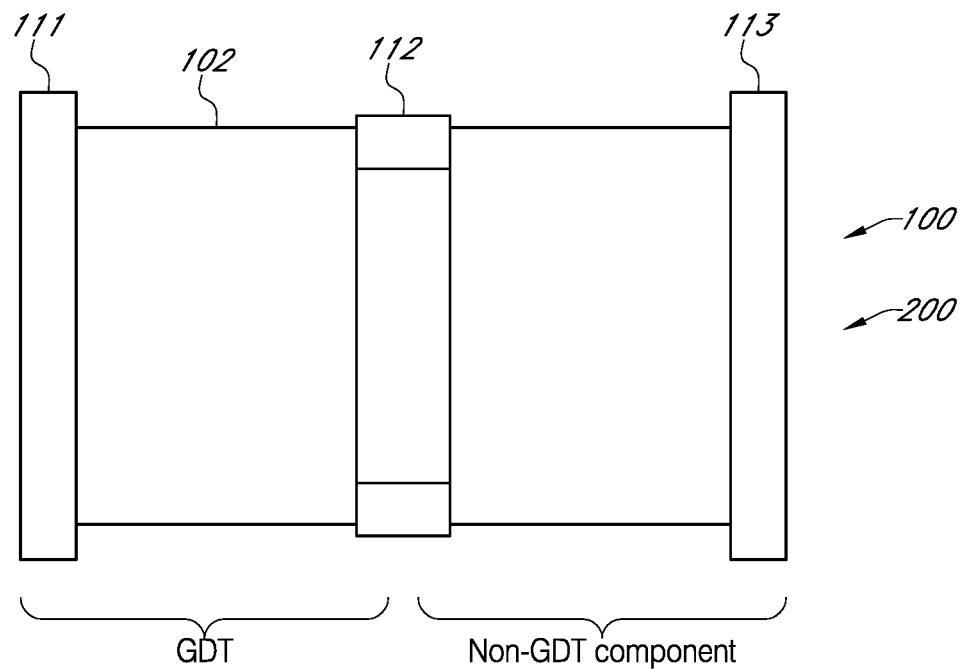
FIG. 11A shows an electrical device that can be a more specific example of the electrical device of FIG. 10.
Figure 11B:
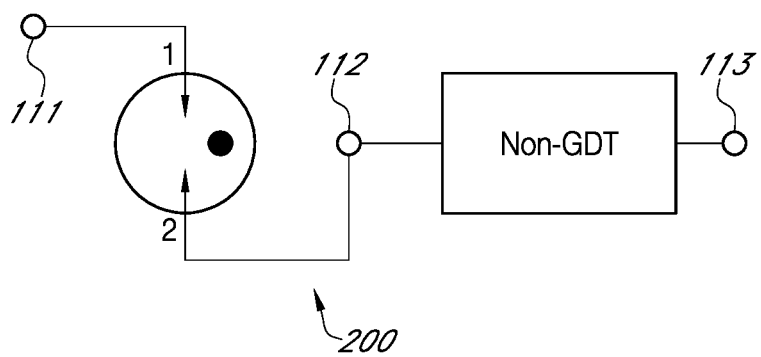
FIG. 11B shows a circuit representation of the electrical device of FIG. 11A.

FIG. 11A shows an electrical device 100 that can be a more specific example of the electrical device 100 of FIG. 10. FIG. 11B shows a circuit representation of the electrical device 100 of FIG. 11A.

In some embodiments, the electrical device 100 of FIG. 11A can include a GDT implemented between a first end electrode 111 and a middle electrode 112, and a non-GDT component implemented between the middle electrode 112 and a second end electrode 113. Accordingly, the electrical device 100 of FIG. 11A can be implemented as a circuit protection device 200. In the example of FIG. 11A, the middle electrode 112 is shown to be configured as a selected electrode as described herein.

Figure 12A:
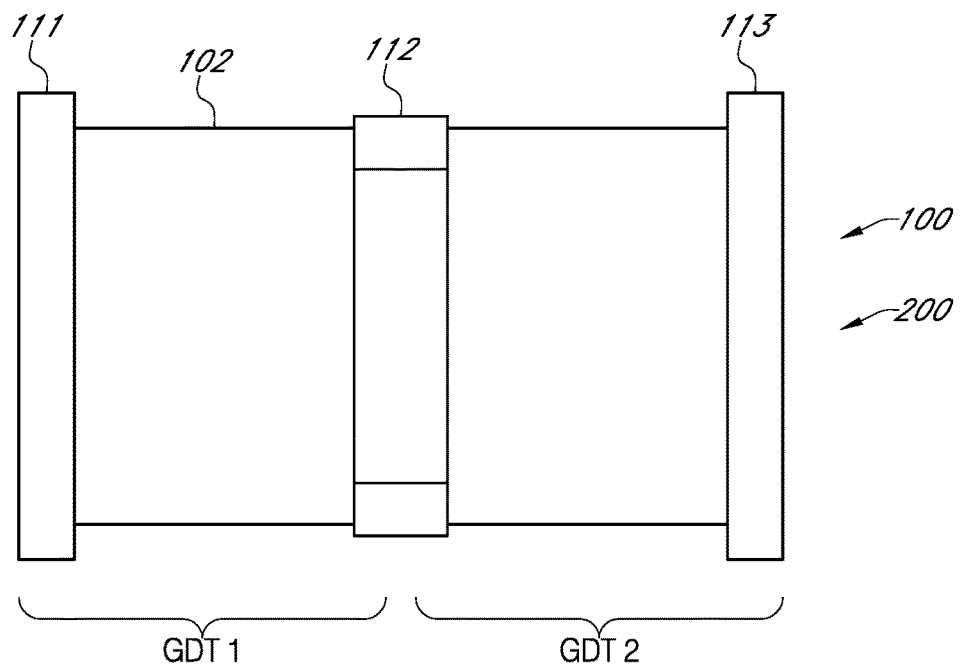
FIG. 12A shows an electrical device that can be another more specific example of the electrical device of FIG. 10.
Figure 12B:
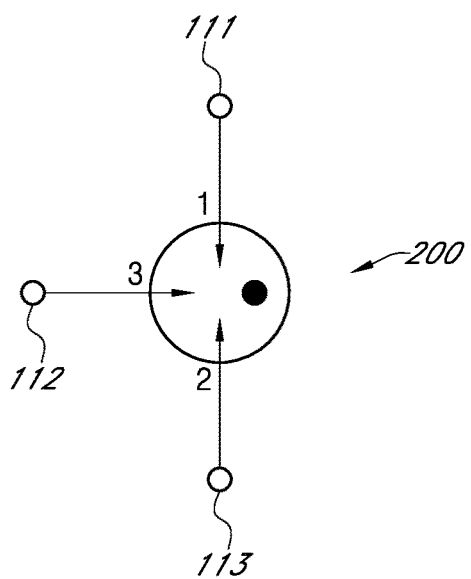
FIG. 12B shows a circuit representation of the electrical device of FIG. 12A.

FIG. 12A shows an electrical device 100 that can be another more specific example of the electrical device 100 of FIG. 10. FIG. 12B shows a circuit representation of the electrical device 100 of FIG. 12A.

In some embodiments, the electrical device 100 of FIG. 12A can include a GDT implemented between a first end electrode 111 and a middle electrode 112, and another GDT implemented between the middle electrode 112 and a second end electrode 113. Accordingly, the electrical device 100 of FIG. 12A can be implemented as a circuit protection device 200. In the example of FIG. 12A, the middle electrode 112 is shown to be configured as a selected electrode as described herein.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An electrical device comprising:
   a body having a cylindrical shape with a radius and a longitudinal axis that extends along a longitudinal direction; and
   a set of electrodes implemented on the body at different locations along the longitudinal direction and configured to allow the electrical device to be positioned and mounted to a surface, the set of electrodes including first and second electrodes each having a circular perimeter with a radius greater than or equal to the radius of the cylindrical shaped body, the first and second electrodes configured to provide first and second engagements with the surface, respectively, the set of electrodes further including a selected electrode having a polygonal shaped perimeter with sides joined by corners, each side spaced from the longitudinal axis of the body by a dimension that is less than the radius of each of the first and second electrodes, each corner spaced from the longitudinal axis of the body by a dimension greater than the radius of each of the first and second electrodes, such that the selected electrode is configured to provide a third engagement with the surface.

2. The electrical device of claim 1, wherein each of the first and second electrodes has a circular perimeter with a radius greater than or equal to the radius of the cylindrical shaped body, such that the settling motion includes a rolling motion, the radius of the first electrode is approximately equal to the radius of the second electrode.

3. The electrical device of claim 1, wherein the dimension between each side of the polygonal shape and the longitudinal axis of the body is less than the radius of each of the first and second electrodes by at least a gap dimension.

4. The electrical device of claim 3, wherein the sides of the polygonal shaped perimeter of the selected electrode includes a square shape having four sides.

5. The electrical device of claim 3, wherein each corner of the polygonal shape of the perimeter of the selected electrode includes a beveled corner that joins each pair of adjacent sides.

6. The electrical device of claim 3, wherein the gap dimension is greater than zero.

7. The electrical device of claim 6, wherein the gap dimension is greater than a coplanarity maximum gap dimension associated with a design specification of a similar electrical device having three electrodes.

8. The electrical device of claim 3, wherein the gap dimension is less than or equal to an upper limit based on an amount of lateral translation of the electrical device resulting from a settling motion when the electrical device is positioned on the surface.

9. The electrical device of claim 8, wherein the gap dimension is less than or equal to half of the amount of lateral translation.

10. The electrical device of claim 3, wherein the gap dimension is less than or equal to an upper limit based on a tolerance associated with manufacturing of the mounting surface.

11. The electrical device of claim 1, wherein the set of electrodes are implemented as two end electrodes and a middle electrode between the two end electrodes.

12. The electrical device of claim 11, wherein the end electrodes are the first and second end electrodes, and the middle electrode is the selected electrode.

13. The electrical device of claim 11, wherein the selected electrode is one of the end electrodes.

14. The electrical device of claim 11, wherein the electrical device is a circuit protection device having a first component implemented between one of the end electrodes and the middle electrode, and a second component implemented between the middle electrode and the other one of the end electrodes.

15. The electrical device of claim 14, wherein the first component is configured as a gas discharge tube (GDT) having first and second electrodes provided by or electrically connected to one of the end electrodes and the middle electrode.

16. The electrical device of claim 15, wherein the second component is configured as another GDT having first and second electrodes provided by or electrically connected to the middle electrode and the other one of the end electrodes.

17. The electrical device of claim 15, wherein the second component is configured as a non-GDT device having first and second electrodes provided by or electrically connected to the middle electrode and the other one of the end electrodes.

18. A method for manufacturing an electrical device, the method comprising:
providing or forming a body such that the body has a cylindrical shape with a radius and a longitudinal axis that extends along a longitudinal direction; and
implementing a set of electrodes on the body at different locations along the longitudinal direction to allow the electrical device to be positioned and mounted to a surface, such that the set of electrodes includes first and second electrodes each having a circular perimeter with a radius greater than or equal to the radius of the cylindrical shaped body, the first and second electrodes configured to provide first and second engagements with the surface, respectively, the set of electrodes further including a selected electrode having a polygonal shaped perimeter with sides joined by corners, each side spaced from the longitudinal axis of the body by a dimension that is less than the radius of each of the first and second electrodes, each corner spaced from the longitudinal axis of the body by a dimension greater than the radius of each of the first and second electrodes, such that the selected electrode is configured to provide a third engagement with the surface.

19. A surface-mountable circuit protection device comprising:
a first component implemented between a first end electrode and a middle electrode; and
a second component implemented between the middle electrode and a second end electrode, such that the first and second components define a body having a cylindrical shape with a radius and a longitudinal axis that extends along a longitudinal direction, two of the first end, middle and second end electrodes configured to provide two engagements with a surface with each of the two electrodes having a circular perimeter with a radius greater than or equal to the radius of the cylindrical shaped body, the remaining one of the first end, middle and second end electrodes having a polygonal shaped perimeter with sides joined by corners, each side spaced from the longitudinal axis of the body by a dimension that is less than the radius of each of the two electrodes, each corner spaced from the longitudinal axis of the body by a dimension greater than the radius of each of the two electrodes, such that the remaining electrode is configured to provide a third engagement with the surface.

* * * * *